(12) United States Patent
Ippolito et al.

(10) Patent No.: US 12,531,570 B2
(45) Date of Patent: Jan. 20, 2026

(54) CIRCUIT ARRANGEMENT COMPRISING A MOS SENSOR, IN PARTICULAR TMOS SENSOR, AND A CORRESPONDING METHOD FOR OPERATING THE CIRCUIT ARRANGEMENT

(71) Applicant: STMicroelectronics S.r.l., Agrate Brianza (IT)

(72) Inventors: Calogero Marco Ippolito, Aci Castello (IT); Michele Vaiana, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 183 days.

(21) Appl. No.: 18/370,052

(22) Filed: Sep. 19, 2023

(65) Prior Publication Data

US 2024/0106451 A1 Mar. 28, 2024

(30) Foreign Application Priority Data

Sep. 20, 2022 (IT) .................. 102022000019257

(51) Int. Cl.
*H03M 1/00* (2006.01)
*H03M 1/12* (2006.01)
*H03M 3/00* (2006.01)

(52) U.S. Cl.
CPC ....... *H03M 1/1255* (2013.01); *H03M 1/1215* (2013.01); *H03M 3/454* (2013.01); *H03M 3/462* (2013.01)

(58) Field of Classification Search
CPC .. H03M 1/1255; H03M 1/1215; H03M 3/454; H03M 3/462; H03M 1/124;
(Continued)

(56) References Cited

U.S. PATENT DOCUMENTS 11,095,261 B2   8/2021  Ippolito et al.
2008/0026717 A1*  1/2008  Huynh ................. H04B 1/0007
                                                          455/337

(Continued)

FOREIGN PATENT DOCUMENTS

IT   102021000006098 A1   9/2022

OTHER PUBLICATIONS

Wang, Wei, et al.: "A low noise current readout architecture with 160 dB transimpedance gain and 1.3 MHz bandwidth," Science Direct, Microelectronics Journal, Mar. 15, 2020, 6 pgs.
(Continued)

*Primary Examiner* — Jean B Jeanglaude
(74) *Attorney, Agent, or Firm* — Crowe & Dunlevy LLC

(57) ABSTRACT

A differential pair of FETs forms a sensor circuit coupled to a differential current reading circuit that includes a current to voltage converter and an analog to digital converter. An ESD protection circuit interposed between the sensor circuit and the differential current reading circuit adds spurious currents to a differential sensor current output by the sensor circuit. A circuit before the ESD protection circuit switches the sign of the differential sensor current according to a period of complementary phase clock signals which correspond to a sampling interval of the analog to digital converter. A circuit selects signals depending on the value of the period of the phase clock signals to eliminate the spurious currents.

15 Claims, 8 Drawing Sheets

(58) Field of Classification Search
CPC ..... H03M 3/34; G01J 5/20; G01J 5/22; G01R 19/10; G01R 1/36; H03F 1/523; H03F 3/393; H03F 3/45183; H03F 3/45475; H03F 3/4565; H03F 3/45744
USPC ........................................................ 341/155
See application file for complete search history.

(56) References Cited

U.S. PATENT DOCUMENTS

2012/0043974 A1* 2/2012 van den Boom ....... H03M 3/49
324/658
2022/0136915 A1 5/2022 Vergauwen et al.

OTHER PUBLICATIONS

Khazhinsky, M.G.: "Protecting against electrostatic discharge (ESD) in complementary metal oxide semiconductor (CMOS) integrated circuits (ICs) manufactured using silicon-on-insulator (SOI) technology," 2014 Elsevier Ltd, 30 pgs.
IT Search Report and Written Opinion for priority application, IT Appl. 102022000019257, report dated May 9, 2023, 11 pgs.

* cited by examiner

CIRCUIT ARRANGEMENT COMPRISING A MOS SENSOR, IN PARTICULAR TMOS SENSOR, AND A CORRESPONDING METHOD FOR OPERATING THE CIRCUIT ARRANGEMENT

PRIORITY CLAIM

This application claims the priority benefit of Italian Application for Patent No. 102022000019257, filed Sep. 20, 2022, the content of which is hereby incorporated by reference in its entirety to the maximum extent allowable by law.

TECHNICAL FIELD

The embodiments of the present disclosure relate to an electronic circuit arrangement comprising a MOS sensor, in particular TMOS sensor, and a corresponding method for operating the circuit arrangement.

BACKGROUND

A Thermal MOS (TMOS) refers to a MOS transistor, manufactured for example in standard CMOS-SOI technology, which through an appropriate micro-processing and dry-etching process is made in a "suspended" silicon mass. The surface of the connection section (between the silicon part in which the TMOS is obtained and the silicon of the remaining part of the die) is made as small as possible (compatibly with the mechanical strength of the connection itself) in order to maximize insulation thermal between the TMOS and the rest of the die.

For example, if it is desired to measure the IR radiation then the sensor is made in such a way that the IR (Infrared) radiation affects only the TMOS and then heats it, while if for example it is desired to make a gas sensor then the sensor structure is made so that the flow of gas flows over the TMOS thereby heating it. The high thermal insulation between the mass of silicon in which the TMOS is present and the rest of the die ensures that the amount of heat that the TMOS receives from the external quantity to be measured (IR, gas flow, or other) causes a higher TMOS temperature difference.

The temperature variations of the TMOS are converted into electrical signals thanks to the current versus voltage (I-V) characteristic of the transistor itself. In this way, the TMOS becomes a key element to develop various new generation sensors at low cost, such as infrared temperature sensors, intrusion sensors, gas flow sensors, etc.

In addition to the cost advantage deriving from the fact that the TMOS sensor is directly integrated within the CMOS-SOI technology, the use of the MOS transistor as an active sensing element has advantages in terms of internal gain, multiplexing inside the sensor, and high temperature sensitivity. Since the TMOS can be used performing in the sub-threshold mode, consuming a very low power, sensors based on TMOS technology are suitable to being inserted in very low consumption systems powered by a battery, allowing a wide range of applications related to mobile phones, smart home, Internet of Things and applications in the security sector.

To operate as desired, the TMOS sensors must be appropriately biased, and then the small current signal produced by the temperature difference must be amplified and post-processed. Therefore, the design of an adequate reading circuit architecture is fundamental to properly detect the signal produced by a TMOS sensor.

The solution here described refers to an electronic circuit arrangement comprising a TMOS sensor arrangement which is intended to: allow a high resolution in the detection of the signal produced by the TMOS sensor; and avoid the necessity to add further costly process steps to the MEMS technology to produce such sensor, directed to avoid that undesired leakage currents due to ESD protection determine an error in reading the signal produced by the TMOS.

A chip of a TMOS sensor may be obtained by arranging in "stacked mode", i.e., one over the other, two silicon dies which are then coupled one to the other by bonding techniques. The die of the TMOS sensor is obtained for instance by a dedicated process technology, CMOS H9SOI (i.e., using an silicon on insulator (SOI) substrate at the 130 nm technology node), with which however, for cost and performance reasons, it is not convenient to obtain also the ASIC interface for the signal conditioning and reading. The die containing the ASIC interface for the signal conditioning and reading is obtained by a standard CMOS H9A technology (i.e., with a bulk semiconductor substrate at the 130 nm technology node), which does contain the dedicated process step to obtain the TMOS sensor. Each terminal of the die of the TMOS sensor and each terminal of the dies of the ASIC must be coupled to pads in order to allow the bonding between the two silicon dies. On each pad an ESD protection has to be placed in order to protect the device from ESD discharges which can happen during the assembly of the dies.

In FIG. 1A, to this regard, it is shown an architecture 10, i.e., a circuit arrangement, of a TMOS sensor and a known reading arrangement which allows to detect, amplify and convert in the digital domain the sensor signal produced by the TMOS sensor.

Reference 11 indicates the TMOS sensor which comprises two TMOS transistors $M_{BLIND}$ and $M_{EXP}$. In the embodiment considered, these transistors are field-effect transistors, for example n-channel FETs. In various embodiments, these two TMOS transistors are provided within one and the same integrated circuit/die and have the same characteristics, in particular with reference to sizing of the transistors; i.e., the transistor $M_{BLIND}$ is substantially a copy of the transistor $M_{EXP}$. Preferably, the TMOS transistors $M_{BLIND}$ and $M_{EXP}$ are positioned close to one another.

The electronic reading circuit, indicated with the reference 20, is configured to amplify the differential signal across the two transistors, for example the differential signal between the drain terminals of the transistors $M_{BLIND}$ and $M_{EXP}$. For instance, as will be described hereinafter, this enables rejection of the common-mode signals and disturbances that reach both of the transistors of the TMOS sensor itself.

The differential signal results from the fact that the TMOS transistor $M_{EXP}$ is "exposed", i.e., the TMOS transistor $M_{EXP}$ is configured to be exposed to the variation in temperature that the quantity that is to be measured produces thereon, whereas the other TMOS transistor $M_{BLIND}$ is "blind", i.e., the TMOS transistor $M_{BLIND}$ is configured in such a way that the physical quantity that is to be measured does not have any effect thereon.

For instance, the quantity that is to be measured is the infrared radiation produced by an object set at a distance from the TMOS sensor 11. As is well known, the infrared radiation is a function of the temperature of the object itself. Consequently, the measurement of the infrared radiation emitted by an object enables indirect measurement of the temperature of the object. In this case, the transistor $M_{BLIND}$ is hence shielded from the IR radiation, whereas the transistor $M_{EXP}$ is configured to receive the IR radiation produced by the object. Consequently, the power of the IR radiation received by the transistor $M_{EXP}$ will cause a slight heating of the transistor $M_{EXP}$ (and not of the transistor $M_{BLIND}$). This difference in temperature consequently generates a variation in the differential signal across the sensor 11 that the reading circuit 20 should amplify. In fact, in general, a minor variation of temperature of the transistor $M_{EXP}$ causes a small shift within the I-V characteristic of the transistor $M_{EXP}$, which in turn generates a minor variation in the differential signal across the transistors $M_{BLIND}$ and $M_{EXP}$.

Consequently, in general, the variation in temperature of the transistor $M_{EXP}$ (and not of the transistor $M_{BLIND}$) that the physical quantity that is to be measured (IR radiation, gas flow, etc.) produces, results in a variation of the electrical characteristics of the transistor $M_{EXP}$ (and not of the transistor $M_{BLIND}$), which in turn results in a variation of the differential signal that the reading circuit should amplify. Instead, the reading circuit should be configured in such a way that the common-mode variations on the transistors $M_{EXP}$ and $M_{BLIND}$ (for example, the variation of the ambient temperature, and in general all the common-mode disturbances) will not produce any variation in the differential signal, and hence their effect is filtered/compensated.

Even though the present disclosure has been devised and studied for amplifying as much as possible the signal generated by a TMOS sensor 11, the electronic reading circuit proposed is functional and suitable also in the case where, instead of the TMOS transistors, two conventional MOS transistors are used since the reading circuit is configured to amplify a differential signal across two transistors, such as a differential signal at the drain terminals of two n-channel transistors.

As explained previously, the electronic reading circuit should amplify the differential signal between the two transistors $M_{BLIND}$ and $M_{EXP}$. To generate such a differential signal there is thus required a circuit that generates an appropriate biasing of the transistors $M_{BLIND}$ and $M_{EXP}$.

For instance, in the embodiment considered, the electronic reading circuit comprises for this purpose two current generators 206 and 208. In particular, the current generator 206 is coupled in series to the source-drain path of the transistor $M_{BLIND}$, and the current generator 208 is coupled in series to the source-drain path of the transistor $M_{EXP}$.

For example, in the embodiment considered, the transistors $M_{BLIND}$ and $M_{EXP}$ are n-channel transistors. In this case, as also described in the document United States Patent Application Publication No. 2017/0205366 A1 (incorporated herein by reference), the current generator 206 may be coupled (for example, directly) between the drain terminal of the transistor $M_{BLIND}$ and a reference voltage $V_{DD}$, which for example corresponds to the supply voltage of the integrated circuit. Likewise, the current generator 208 may be coupled (for example, directly) between the drain terminal of the transistor $M_{EXP}$ and the reference voltage $V_{DD}$.

The gate terminal of the transistor $M_{BLIND}$ is coupled (for example, directly) to the gate terminal of the transistor $M_{EXP}$, which in turn is coupled (for example, directly) to a reference voltage VG. In general, when instead of the TMOS transistors two normal transistors are used, the input signal can be applied between the gate terminals of the transistors $M_{BLIND}$ and $M_{EXP}$.

The circuit of FIG. 1A also comprises a common-mode control circuit. In particular, the source terminal of the transistor $M_{BLIND}$ is coupled (for example, directly) to the source terminal of the transistor $M_{EXP}$, which in turn is coupled (for example, directly) by means of a transistor $M_B$ to a reference voltage, for example ground GND. Considering that the TMOS transistors are n-channel transistors, preferably also the transistor $M_B$ is an n-channel transistor. The drain terminal of the transistor $M_B$ is then coupled (for example, directly) to the source terminal of the transistor $M_{BLIND}$ and to the source terminal of the transistor $M_{EXP}$, i.e., the terminal 106, and the source terminal of the transistor $M_B$ is coupled (for example, directly) to the reference voltage, e.g. GND.

Consequently, the sensor 11 is coupled to the reading circuit 20 by means of three terminals: a terminal 102 that corresponds to the drain terminal of the transistor $M_{BLIND}$; a terminal 104 that corresponds to the drain terminal of the transistor $M_{EXP}$; and a terminal 106 that corresponds to the source terminals of the transistors $M_{BLIND}$ and $M_{EXP}$.

Each of the current generators 206 and 208 supplies a current $I_B$. For instance, the current generators 206 and 208 may be implemented with a current mirror. Consequently, in the circuit of FIG. 1, the bias current of the transistor $M_{EXP}$ and of the transistor $M_{BLIND}$ is substantially equal to $I_B$, whereas the current of the transistor $M_B$ is substantially equal to $2 \cdot I_B$.

This part of the circuit hence corresponds substantially to an operational transconductance amplifier, as described, for example, in U.S. Pat. No. 6,693,485 B1 (incorporated by reference).

In the circuit of FIG. 1A, the gate terminal of the transistor $M_B$ is driven by a control circuit 204. In particular, the control circuit 204 is configured to monitor the voltage $V_{O2}$ at the drain terminal of the transistor $M_{BLIND}$ and the voltage $V_{O1}$ at the drain terminal of the transistor $M_{EXP}$, as well as to generate the driving signal for the gate terminal of the transistor $M_B$ as a function of the above voltages. In particular, the control circuit 204 is configured to control (via feedback of the voltages $V_{O1}$ and $V_{O2}$) the voltage at the gate of the transistor $M_B$ in such a way that the common mode of the voltages $V_{O1}$ and $V_{O2}$ is equal to a reference voltage $V_{CM}$; i.e., the control circuit 204 is configured to regulate the gate-to-source voltage $V_{GS}$ of the transistor $M_B$ in such a way that:

$$(V_{O1}+V_{O2})/2=V_{CM}$$

The control circuit 204, here represented schematically by a simple comparison circuit 15, i.e., a differential amplifier, which receives the voltages $V_{O1}$ and $V_{O2}$ and reference voltage $V_{CM}$ outputting the gate-to-source voltage $V_{GS}$ of the transistor $M_B$ according to the above law, can be implemented with a regulator, which comprises at least one component I (Integral) and possibly a component P (Proportional), by means of one or more operational amplifiers.

The reading circuit is configured in such a way that the transistors $M_{BLIND}$ and $M_{EXP}$ are biased to operate in the sub-threshold region. For instance, once the bias current of the transistors $M_{EXP}$ and $M_{BLIND}$ is fixed equal to $I_B$, these transistors can be sized with a ratio (width/length W/L) sufficiently high to guarantee that the voltage between the gate and source terminals $V_{GS}$ is lower than the threshold voltage VT of the transistors, i.e., $V_{GS}<VT$.

Thus, the drain terminal of the transistor $M_{BLIND}$ and the drain terminal of the transistor $M_{EXP}$ are coupled to a reading circuit 20 which detects and amplifies the signal at nodes 102, 104, in particular, the circuit 20 comprises two input terminals for receiving, respectively, a first sensor signal current $i_s/2$ and a second sensor signal current $i_s/2$. Such terminals are designated as $V_{O1}$ and $V_{O2}$ as the voltages on the drain of the exposed and blind FETs of the sensor 11, which correspond also to the output nodes of the bias current generators 208, 206 in which the bias current $I_B$ is injected. In FIG. 1A such sensor signal currents are brought to the inputs of a current to voltage, i.e., transimpedance, amplifier 13, which converts their difference and produces an analog differential voltage $V_{ADC}$. An analog to digital converter 14 converts the analog differential voltage $V_{ADC}$ in a digital sensor output OUT.

FIG. 1B shows the same architecture with the addition of the ESD protections.

The TMOS sensor 11 is obtained on a respective sensor die 301 (CMOS H9SOI) with a source pad SP coupled to the sources of the FET $M_{BLIND}$, $M_{EXP}$, a gate pad GP coupled to their gate electrodes, a first drain pad DBP and a second drain pad DEP coupled to the drain of the FET $M_{BLIND}$ and $M_{EXP}$, respectively.

Such a sensor die 301, as mentioned above, is to be bonded to an ASIC die, here indicated with reference 302. As mentioned, each terminal of the die of the TMOS sensor and each terminal of the dies of the ASIC must be coupled to pads in order to allow the bonding between the two silicon dies. On each pad an ESD protection has to be placed in order to protect the device from ESD discharges which can happen during the assembly of the dies.

Thus, the rest of the circuit of FIG. 1A, i.e., components 204, 206, 208, 13, 14 is placed on an ASIC die 302 and comprises an input pad P1 coupled to the voltage supply $V_{DD}$, an input pad P2 coupled to the input of the current to voltage amplifier 13 corresponding to node $V_{O1}$, an input pad P3 coupled to the input of the current to voltage amplifier 13 corresponding to node $V_{O2}$, an input pad P4 to apply the gate reference voltage VG, an input pad P5 coupled to the drain of the FET $M_B$, i.e. node 106, and an input pad P6 to the source of the FET $M_B$ and to ground GND.

An ESD protection circuit 21, placed on the ASIC die 302, e.g., CMOS H9A, comprises pads E1, E2, E3, E4, E5, E6 respectively coupled to pads P1, P2, P3, P4, P5, P6, i.e., for the bonding between the terminals of the die 303 of the circuit 21 with the ASIC die 302 of the reading circuit 20, and pads ES1, ES2, ES3, E4 coupled to the sensor pads DBP, DEP, GP, SP respectively, i.e., for the bonding between the terminals of the die 303 of the circuit 21 with the sensor die 301 of the sensor circuit 11.

A clamp diode 22 is coupled with its cathode to the pad E1 and anode to the pad E6. Pads ES2 and E2 are coupled together to coupled pad DBP to pad P2, pads ES3 and E3 are coupled together to couple pad DEP to pad P3. Pads ES4 and E4 are coupled together to couple pad GBP to pad P4. Pads ES5 and E5 are coupled together to couple pad SP to pad P5.

Pad E1 is coupled to the cathodes of four diodes D1, D3, D5, D7 in parallel, the first of which, diode D1, is coupled by the anode to the pad E2 (and ES2), the second, diode D3, to the pad E3 (and ES3), the third, diode D5, to the pad E4 (and ES4), the fourth, diode D7, to pad E5 (and ES5).

Pad E6 is coupled to the anodes of further four diodes D2, D4, D6, D8 in parallel, the first of which, diode D2, is coupled by the anode to the pad E2 (and ES2), the second, diode D4, to the pad E3 (and ES3), the third, diode D6, to the pad E4 (and ES4), the fourth, diode D8, to pad E5 (and ES5).

The pads of one die are coupled to the pads of the other by respective bondings, e.g., wire bonds 310. The embodiment here described, as mentioned corresponds to having the ESD protection circuit 21 in the ASIC die 302, e.g., H9A, i.e., bonding wires coupling pads DBP, DEP, GP, SP with ES1, ES2, ES3, ES4 respectively. In variant embodiments, the protection circuit 21 may be obtained in the sensor die 301 in that case the bonding wires coupled pads E1, E2, E3, E4, E5, E6 with P1, P2, P3, P4, P5, P6 respectively. Considerations about performance may suggest to put the circuit 21 in the ASIC die 302 as in the embodiment shown in FIG. 1B.

Thus, the ESD protection circuit 21 is a circuit interposed between at least said first node, e.g. pad DBP, and second node, e.g. pad DEP, of such sensor circuit 11, on one side, and the first and second terminals of the differential current reading circuit 20, which in particular comprises a plurality of diodes, e.g. diodes D1, . . . , D10 interdicting injection of currents from the voltage supply VDD and ground GDD in such nodes DBP, DEP of the sensor circuit 11 and the terminals of the differential current reading circuit 20.

In the high resolution application the signal current of the TMOS 11 sensor must be read with the precision of the picoampere. The noise and in particular the leakage injected in the pad by the ESD protection have a magnitude typically greater than picoamperes, thus greater than the required precision, hence for this reason the architecture of FIGS. 1A, 1, is not suitable for high resolution application.

In FIG. 1B are also indicated the signal contributions produced by the TMOS sensor 11, current $i_{EXP}$ and $i_{BLIND}$ flowing in the drains of FET $M_{EXP}$ and $M_{BLIND}$ respectively, the undesired contributions (leakage plus noise) injected by the ESD protections on the drain pads DBP, DEP of the TMOS sensor 11 ($i_{s1}$, $i_{s2}$, $i_{s3}$, $i_{s4}$), the undesired contributions (leakage plus noise) injected by the ESD protections on the drain pads DBP, DEP of the TMOS sensor 11 by the bias current generators 206, 208, injecting bias currents $I_B$ ($i_{s5}$, $i_{s6}$). In the known architectures these disturbances in particular are relevant, since, being injected on the drain electrodes of FET $M_{EXP}$ and $M_{BLIND}$, they sum on the actual sensor signal, currents $i_{EXP}$ and $i_{BLIND}$, and become undistinguishable from such sensor signal.

It should be noted that the unwanted current signals on the gate terminals are not highlighted in FIG. 1B, since by definition the current cannot flow on a gate terminal and therefore the problem on the gate terminals does not arise. It is also noted that the unwanted current signals on the source terminals are not highlighted in FIG. 1B, as they are highly rejected, and therefore in most applications the unwanted signal injected by the source terminals $i_s$ highly attenuated before adding to the useful signal of the TMOS sensor. Therefore, in FIG. 1A there are only the useful current of the TMOS FET $M_{EXP}$ and $M_{BLIND}$ and the main unwanted components. The following equations reports the input voltage to the ADC converter 14 and the output of the ADC converter in relation to the circuital arrangement 10 as represented in FIG. 1B:

$$V_{ADC}=[(i_{EXP}-i_{BLIND})+(i_{s1}-i_{s2})+(i_{s4}-i_{s3})+(i_{s5}-i_{s6})]\cdot GAIN$$

and $$OUT(i)=OUT_{ADC}(i)V_{ADC}\cdot G_{ADC}=[(i_{EXP}-i_{BLIND})+(i_{s1}-i_{s2})+(i_{s4}-i_{s3})+(i_{s5}-i_{s6})]\cdot GAIN\cdot G_{ADC}$$

where ($i_{s1}-i_{s2}$) is the leakage injected by diode protection of pad DBP, ($i_{s4}-i_{s3}$) is the leakage injected by diode protection of the pad DEP, ($i_{s5}-i_{s6}$) is noise injected by current sources 206, 208 injecting the bias current $I_B$, then GAIN is the gain of the current to voltage amplifier 13 and GADC the gain of the ADC converter 14. OUT is the digital output, where index i identifies the sampling interval, in this case corresponding to the ADC converter 14 output $OUT_{ADC}$. ($i_{EXP}-$ $i_{BLIND}$) is the actual, or desired, TMOS sensor signa, while $(i_{s1}-i_{s2})+(i_{s4}-i_{s3})+(i_{s5}-i_{s6})$ are the unwanted, or spurious, signals.

Thus, in conclusion, in the architecture of FIGS. 1A and 1B, undesired signal originated by the ESD protections (as well as disturbances from the bias current generators) limit the resolution with which the actual, i.e., desired, sensor signal coming from the TMOS sensor is read.

Considering the foregoing, there is a need in the art to provide solutions that are able to overcome one or more of the limits noted above.

SUMMARY

One or more embodiments comprises a circuit arrangement comprising a MOS based, in particular TMOS, sensor having distinctive elements.

The embodiments moreover concern a corresponding method for operating such circuit arrangement.

Various embodiments of the present disclosure regard a circuit arrangement comprising a sensor circuit and electronic reading circuit of a signal of said sensor circuit, said sensor circuit comprising: a first FET and a second FET arranged in a differential pair, which supplies a differential current to a respective first node and a respective second node; said electronic reading circuit comprising: a differential current reading circuit comprising a first input terminal coupled to said second node and a second input terminal coupled to said first node, said differential current reading circuit comprising at least an analog to digital converter coupled to said second node and to said first node to output a digital signal; said circuit arrangement comprising an ESD protection circuit interposed between at least said first and second node of said sensor circuit and the first and second terminals of said differential current reading circuit, in particular comprising diodes interdicting injection of currents from the voltage supply and ground in said nodes and terminals in such nodes of the sensor circuit and terminals of the differential current reading circuit, said ESD protection circuit adding spurious currents to said differential sensor current. The circuit arrangement comprises: a phase clock signal generator generating complementary phase clock signals having a period corresponding to the sampling interval of the analog to digital converter. The sensor circuit further comprises: a circuit for switching the sign of said differential sensor current according to said period of the complementary phase clock signals before inputting said ESD protection circuit. The differential current reading circuit comprises a circuit configured for operating a selection of signals at its output depending on the value of said period of the phase clock signals, selecting said differential sensor current and eliminating said spurious currents.

In various embodiments, said circuit configured for operating a selection of signals depending on the value of said period of the phase clock signals comprises a chopper circuit, coupled to the output of the ESD protection circuit, configured to switch the polarity of the signals at its input and a digital averaging circuit coupled to the output of the analog to digital converter, said digital averaging circuit performing an average over a window of sampling intervals which double of said period of the complementary phase clock signals.

In various embodiments, said chopper circuit is coupled to the input of the analog to digital converter.

In various embodiments, said chopper is coupled to the output of the digital to analog converter and operates digitally.

In various embodiments, said circuit configured for operating a selection of signals depending on the value of said period of the phase clock signals comprises a bandpass sigma delta converter and said digital averaging circuit coupled to the output of the bandpass sigma delta analog to digital converter operating as decimation filter with respect to the output of the bandpass sigma delta converter.

In various embodiments, said circuit for switching the sign of said differential sensor current according to said period of the complementary phase clock signals (before inputting said ESD protection circuit comprises: a further first differential pair and second differential pair of FET coupled between the first FET and the first node and the second FET and the second node; said phase clock signal generator generating complementary phases with each sampling interval of the analog to digital converter driving the further first differential pair and second differential pair.

In various embodiments, said sensor comprises: a first FET and a second FET; a first node, a second node, and a third node, where a drain terminal of said first FET is coupled to said first node, a drain terminal of said second FET is coupled to said second node, and the source terminals of said first FET and of said second FET are coupled to said third node; a first bias-current generator configured to generate a bias current at an output of said first bias-current generator, where the output of said first bias-current generator is coupled to said first node; a second bias-current generator configured to generate a bias current at an output of said second bias-current generator where the output of said second bias-current generator is coupled to said second node; and a third FET, where a drain terminal of said third FET is coupled to said third node and a source terminal of said third FET is coupled to a reference voltage.

In various embodiments, a regulation circuit is configured to drive a gate terminal of said third FET in such a way as to regulate the common mode of the voltage at said first node and of the voltage at said second node on a required value, in particular said regulation circuit being configured to drive said gate terminal of said third FET in such a way that:

$(V_{O1}+V_{O1})/2=V_{CM}$, i.e., half the sum of the voltage at said first node and of the voltage at said second node is equal to the required value.

In various embodiments, said first FET and said second FET are MOS transistors, preferably n-channel devices, in particular TMOS transistors.

In various embodiments, said sensor circuit is arranged on a first die, said differential current reading circuit is arranged on a second die, and said ESD protection circuit is arranged on a third die.

The solution described herein also refers to a method for operating a circuit arrangement according to the previous embodiments, comprising: generating complementary phase clock signals having a period corresponding to the sampling interval of the analog to digital converter; switching the sign of said differential sensor current according to said period of the complementary phase clock signals before inputting the ESD protection circuit; and operating a selection of signals at the output of the ESD protection circuit depending on the value of said period of the phase clock signals, selecting said differential sensor current and eliminating said spurious currents.

BRIEF DESCRIPTION OF THE DRAWINGS

The embodiments of the present disclosure will now be described with reference to the annexed drawings, which are provided purely by way of non-limiting example, and in which.

DETAILED DESCRIPTION

In the ensuing description, various specific details are illustrated, aimed at providing an in-depth understanding of the embodiments. The embodiments may be provided without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present disclosure is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Moreover, particular conformations, structures, or characteristics may be combined in any adequate way in one or more embodiments.

The references used herein are provided only for convenience and hence do not define the sphere of protection or the scope of the embodiments.

Figure 1A:
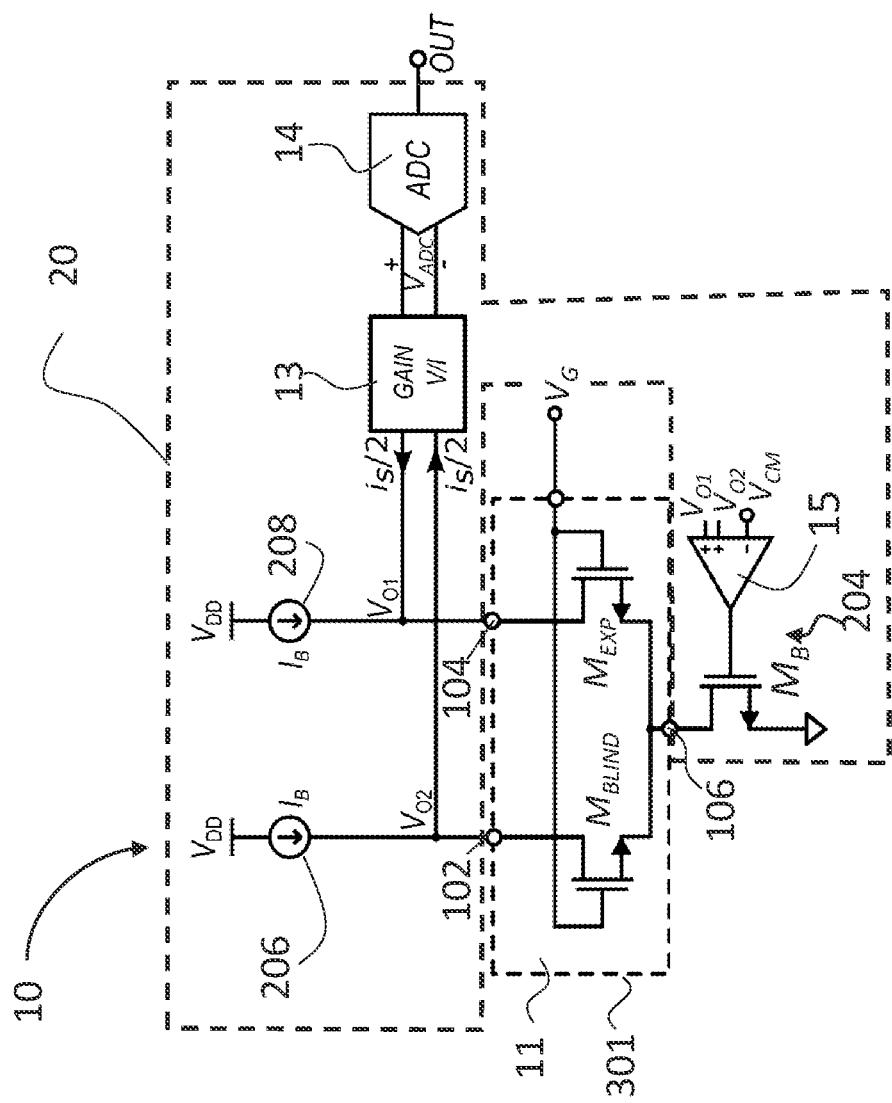
FIG. 1A and FIG. 1B have bene already described in the foregoing.
Figure 1B:
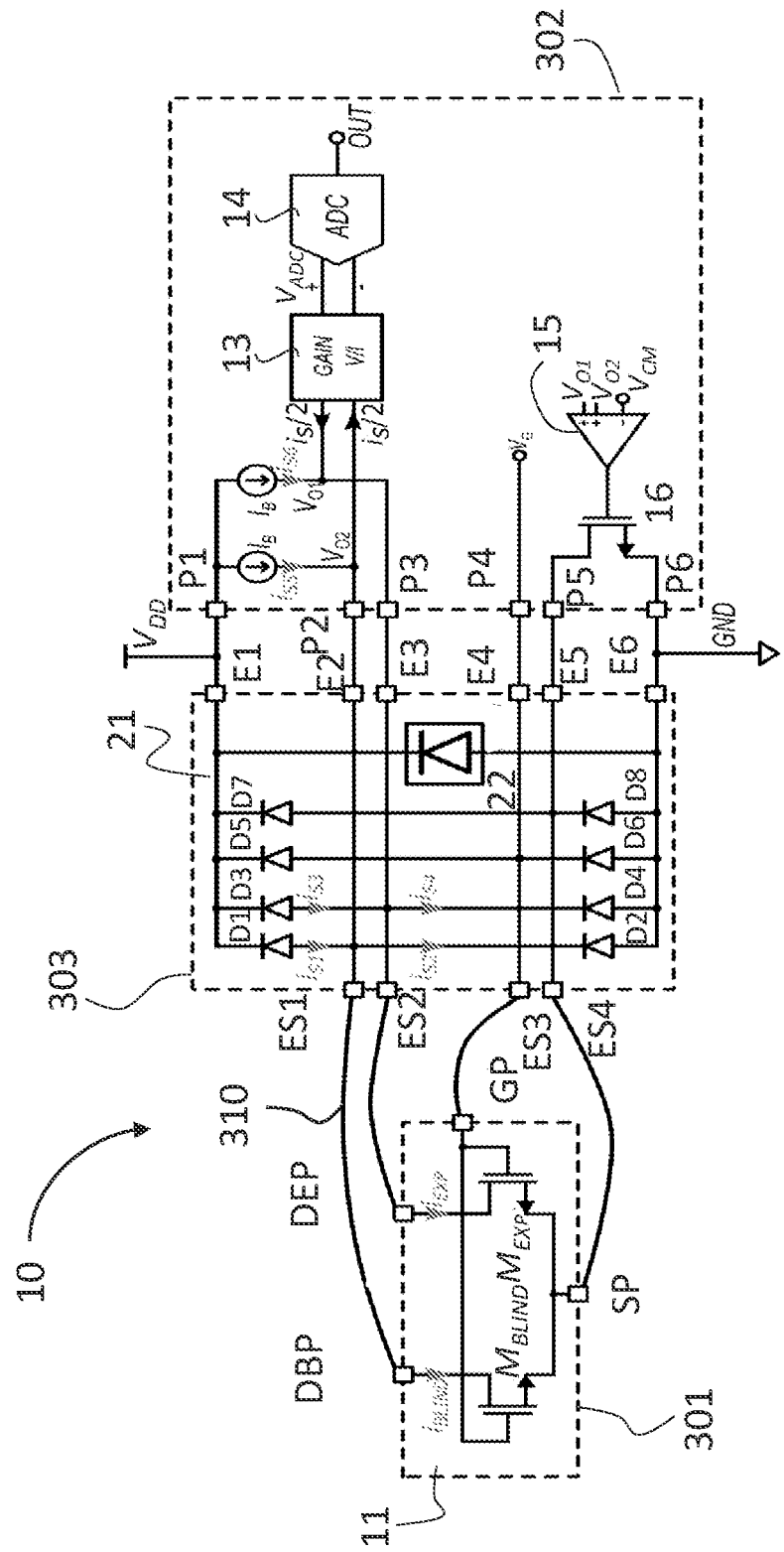

In FIGS. 2A to 5B described hereinafter, parts, elements or components that have already been described with reference to FIG. 1A, 1B are designated by the same references used previously; the description of these elements presented previously will not be repeated hereinafter in order not to overburden the present detailed description.

As explained previously, various embodiments of the present disclosure regard an electronic circuit architecture, i.e., a circuit arrangement, comprising a MOS based, in particular TMOS, sensor and a corresponding method for operating the circuit arrangement.

Figure 2A:
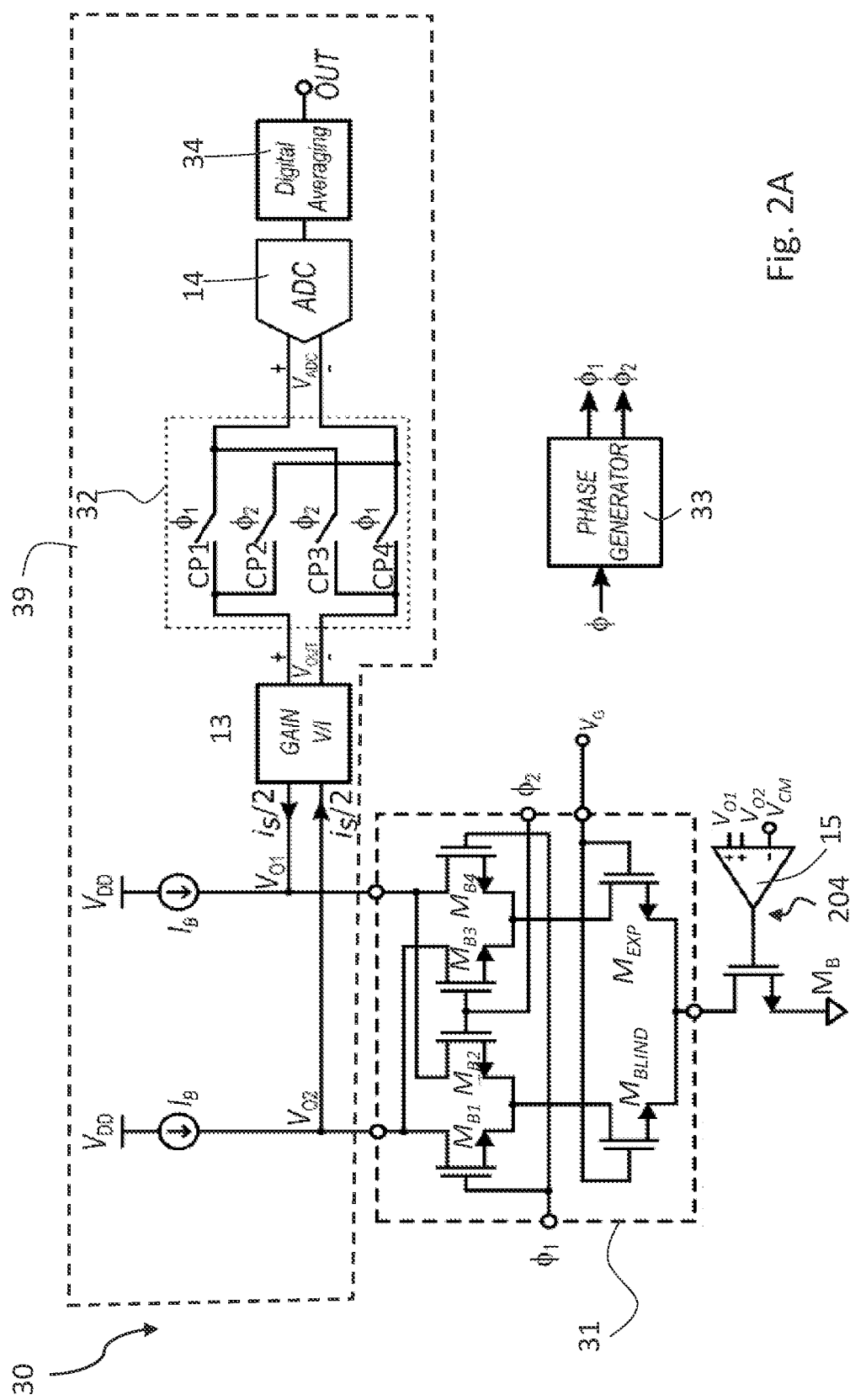
FIG. 2A shows schematically an architecture of a TMOS sensor and reading circuit according to the solution described herein.

FIG. 2A shows an electronic architecture 30, which determines a circuital arrangement of a TMOS sensor 31 and a reading circuit 39 which allows to detect, amplify and convert in the digital domain the signal produced by the TMOS sensor.

The schematics of the electronic architecture 30 is similar to the electronic architecture 10 of FIG. 1A, however the sensor TMOS 31 differs from the TMOS sensor 11 in FIG. 1A in that, in addition to the TMOS sensor 11 structure, with FET, in particular TMOS, $M_{BLIND}$ and $M_{EXP}$, it includes a first further pair of FETs, in particular MOS transistors $M_{B1}$, $M_{B2}$, also coupled together by their source electrodes, and a second further pair of FETs, in particular, MOS $M_{B3}$, $M_{B4}$, also coupled together by their source electrodes. The sources of the first further pair $M_{B1}$, $M_{B2}$ and of the second further pair $M_{B3}$, $M_{B4}$ are coupled to the drains of the FET $M_{BLIND}$ and $M_{EXP}$ respectively. The drain of the MOS $M_{B1}$, i.e., the MOS placed between the drain of $M_{BLIND}$ and the terminal VO2, is coupled to the drain of the MOS $M_{B3}$, while the drain of the MOS $M_{B4}$, the MOS transistor placed between the drain of $M_{EXP}$ and the terminal $V_{O1}$, is coupled to the drain of MOS $M_{B2}$. The gates of MOS $M_{B2}$ and $M_{B3}$ are coupled together. The nodes of terminals $V_{O2}$ and $V_{O1}$ thus, in which the bias current generators 206 and 208 inject bias currents $I_B$, in the architecture 30 correspond to such drain electrodes in common, and their voltage brought as input of the current to voltage amplifier 13, which converts their difference and produces at its output a differential voltage VOUT.

In this embodiment 30, the architecture, with respect to the architecture 10 of FIG. 1A, also further comprises on the amplification interface 39, with respect to the amplification interface 20 of FIG. 1A, a chopper circuit 32 which receives the differential voltage VOUT from the amplifier 13. The positive terminal of the differential voltage VOUT is coupled to two switches CP1, CP2 in parallel, one coupling to the positive input and the other to the negative input of the ADC 14, on which the input analog differential voltage $V_{ADC}$ is formed, driven in their open and close states by complementary phase clock signals Φ1 and Φ2. In the same way the negative terminal of differential voltage VOUT is coupled to other two switches in parallel CP3, CP4, one coupling to the positive input and the other to the negative input of the ADC 14, driven by the phase clock signals Φ2 and Φ1. Thus, the chopper 32 is configured to switch the polarity of the input of the ADC 14 for instance at each sampling interval. It is underlined that if the polarity is changed at each sampling interval (e.g., Φ1=1 Φ2=0; Φ1=0 Φ2=1; Φ1=1 Φ2=0; Φ1=0 Φ2=1; . . . ), then the digital averaging block 34 averages on two samples. If the polarity is changed every two sampling intervals, i.e. doubles, (e.g., Φ1=1 Φ2=0; Φ1=1 Φ2=0; Φ1=0 Φ2=1; Φ1=0 Φ2=1; . . . ) then the digital averaging block 34 has to perform the average on 4 sampling intervals, i.e. the period on which the average doubles as well. The proportionality with the period on which the digital averaging block 34 averages is maintained for other multiples of the sampling interval as period for changing the polarity in the chopper.

Also, the reading circuit 39 includes a Digital Averaging block 34 which input $i_s$ coupled at the output of the ADC 14 and it is configured to average the input signal over a number n of samples of the ADC 14.

The architecture 30 further comprises a Phase Generator block 33, which output drives the gates of the further first pair of MOS $M_{B1}$, $M_{B2}$, and the further second pair of MOS $M_{B3}$, $M_{B4}$, i.e. phase clock signal Φ1 coupled to the gates of MOS $M_{B1}$, $M_{B4}$, and phase clock signal $Φ_2$, which is coupled to the gates of MOS $M_{B2}$, $M_{B3}$. Phase Generator block 33 supplies also the phase clock signals Φ1 and Φ2 to the switches CP1, . . . , CP4 as explained above. Thus, the Phase Generator block 33 is configured to generate a pair of complementary logic signals which swap level, in the embodiment shown, at each sampling interval (e.g., Φ1=1 Φ2=0; Φ1=0 Φ2=1; Φ1=1 Φ2=0; Φ1=0 Φ2=1; . . . ) or with each multiple of two sampling intervals (e.g. Φ1=1 Φ2=0; Φ1=1 Φ2=0; Φ1=0 Φ2=1; Φ1=0 Φ2=1; . . . ), in particular to drive the chopper 32 and the TMOS sensor 31.

The Phase generator block 33 generates the phase clock signals Φ1 and Φ2 on the basis of an input reference phase Φ received for instance by a logic module, not shown, which controls the operation of the circuit arrangement 30.

Figure 2B:
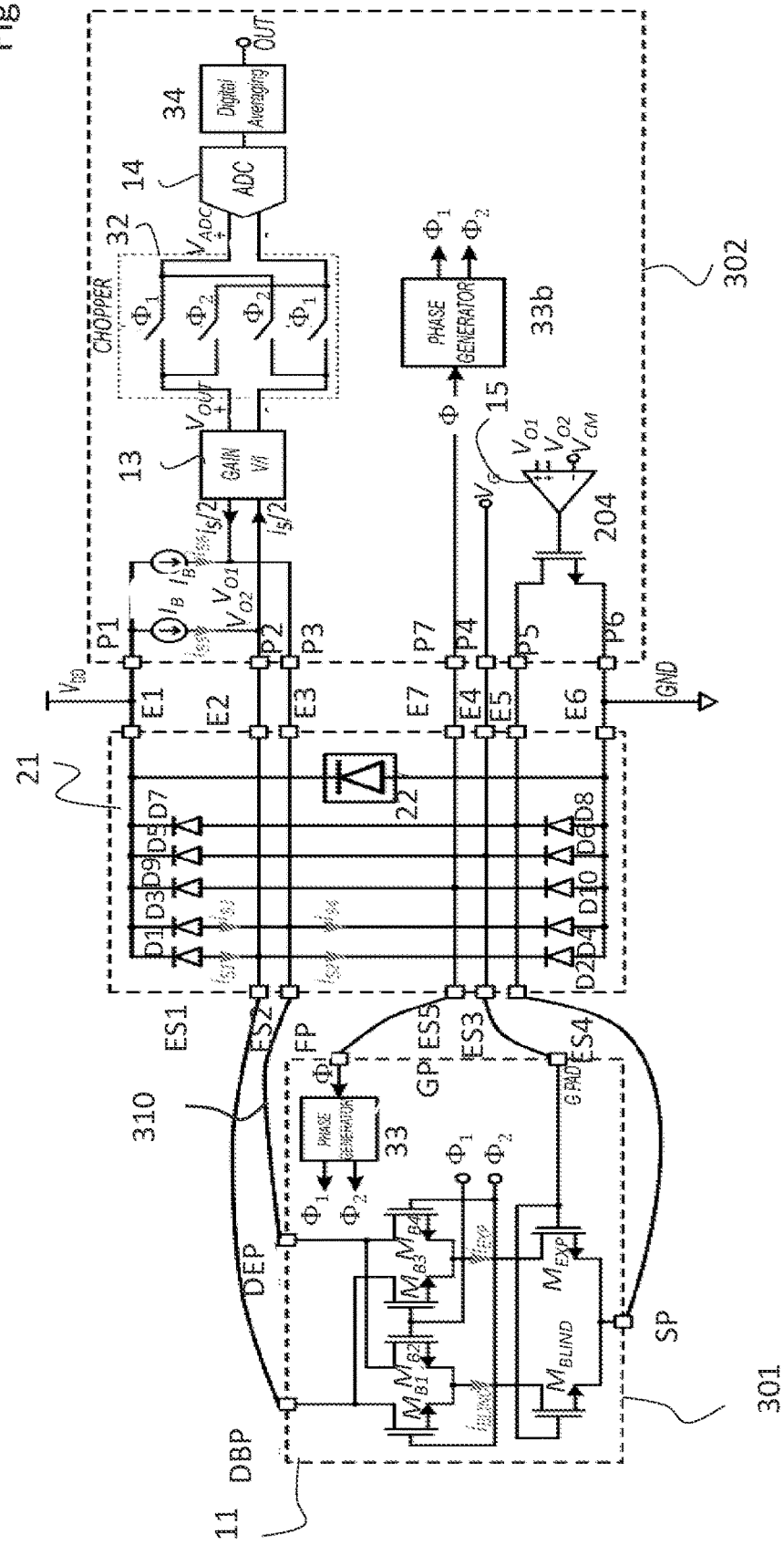
FIG. 2B shows schematically the architecture of FIG. 2A equipped with a ESD protection.

It is underlined that the input reference phase Φ represents the signal from which the phase clock signals Φ1 and Φ2 are generated. By way of example, the phase clock signal Φ1 may simply be a buffered version (e.g., using two CMOS inverter in series on phase Φ) of the input phase clock signal Φ, while the other phase clock signal Φ2 may be obtained with an inversion of the input reference phase clock signal Φ (e.g., using a single inverter CMOS on the input reference phase clock signal Φ). Usually, it is preferred to use techniques which from the input reference phase clock signal Φ generate phase clock signals Φ1 and Φ2 which are complementary but without reciprocal overlap. The input reference phase clock signal Φ i$_s$ coupled to the pad to allow to generate locally on both dies 301 and 301, as shown in FIG. 2B, the phase clock signals Φ1 and Φ2 in a corresponding manner. Alternatively, a sole phase generator, for instance placed on the ASIC die 302 may be used, while the phase clock signals Φ1 e Φ2 could be then brought on the sensor die 301, however this could be not convenient, as this would probably require a longer wire bonding.

In FIG. 2B it shown the same architecture of FIG. 2A with the addition of the ESD protection, i.e., the ESD protection circuit 21, placed on the ASIC die 302, e.g. CMOS H9A, although as mentioned can be placed on the sensor die 301 as well, and its respective pads E1, E2, E3, E4, E5, E6 respectively coupled to pads P1, P2, P3, P4, P5, P6 of the ASIC die 302, and pads ES1, ES2, ES3, E4 coupled to pads DBP, DEP, GP, SP of the sensor die 301 and the currents indicated, like in FIG. 1B. The difference in this case is that there are provided pairs of pads ES5-P7 (die 302-die 301) and pads E7-FP (die 302-die 301) to carry the phase clock signal Φ as input controlling the phase generator 33 in the reading circuit 39 and sensor circuit 31. The ESD protection circuit 21 includes further diodes D9 added to diodes D1-D7 and diode D10 added to diodes D2-D8, to protect such further pads from the voltage supply $V_{DD}$ and ground GND, respectively.

In FIG. 2B in particular are indicated the actual signal contributions from the TMOS sensor 11, $i_{EXP}$ and $i_{BLIND}$, the undesired signal contributions (leakage plus noise) injected by the ESD protections on the drain pads DBP, DEP of the TMOS sensor, $i_{s1}$, $i_{s2}$, $i_{s3}$, $i_{s4}$, and the undesired signal contributions (leakage plus noise) injected by the ESD protections on the drain pads DBP, DEP of the TMOS sensor 11 by the bias current generators 12a, 12b, injecting bias currents $I_B$, $i_{s5}$, $i_{s6}$. As already explained with reference to FIG. 1B, these represent the actual, desired, sensor signal, and the main contributions limiting the resolution.

The following equations are representing the ADC input voltage $V_{ADC}$ and its digital output $OUT_{ADC}$ for the architecture 30, i.e. circuital arrangement, of FIG. 2A, 2B, taking in account by way of example four samples converted in the digital domain, corresponding to digital outputs $OUT_{ADC}$, $OUT_{ADC}$ $OUT_{ADC}$, $OUT_{ADC}$:

$$OUT_{ADC}(0) = V_{ADC} \cdot G_{ADC} =$$
$$+V_{OUT} \cdot G_{ADC} == [(i_{EXP} - i_{BLIND}) + (i_{S1} - i_{S2}) + (i_{S4} - i_{S3}) + (i_{S5} - i_{S6})] \cdot$$
$$GAIN \cdot G_{ADC} i = 0 \to \phi_1 = 1, \phi_2 = 0$$

$$OUT_{ADC}(1) = V_{ADC} \cdot G_{ADC} =$$
$$-V_{OUT} \cdot G_{ADC} == [(i_{EXP} - i_{BLIND}) - (i_{S1} - i_{S2}) - (i_{S4} - i_{S3}) - (i_{S5} - i_{S6})] \cdot$$
$$GAIN \cdot G_{ADC} i = 1 \to \phi_1 = 0, \phi_2 = 1$$

$$OUT_{ADC}(2) = V_{ADC} \cdot G_{ADC} =$$
$$+V_{OUT} \cdot G_{ADC} == [(i_{EXP} - i_{BLIND}) + (i_{S1} - i_{S2}) + (i_{S4} - i_{S3}) + (i_{S5} - i_{S6})] \cdot$$
$$GAIN \cdot G_{ADC} i = 2 \to \phi_1 = 1, \phi_2 = 0$$

$$OUT_{ADC}(3) = V_{ADC} \cdot G_{ADC} =$$
$$-V_{OUT} \cdot G_{ADC} == [(i_{EXP} - i_{BLLID}) - (i_{S1} - i_{S2}) - (i_{S4} - i_{S3}) - (i_{S5} - i_{S6})] \cdot$$
$$GAIN \cdot G_{ADC} i = 3 \to \phi_1 = 0, \phi_2 = 1$$

The Phase Generator block 33 for each sampling interval of the ADC 14 alternates the values of phase clock signals φ1 and φ2 between high logic level and low logic level in a complementary way. The values of such phases are therefore φ1=1 and φ2=0 during a sampling interval, then φ1=0 and φ2=1 in the subsequent interval, and so on. The same Phase Generator block 33 can be integrated in the sensor die 301 CMOS H9SOI comprising the TMOS sensor 31 and in the ASIC die 302 CMOS H9A: in such case a bonding between the two dies 301, 302 has to be provided to couple both the phase generators to a phase input clock signal 4. Alternatively, the Phase Generator 33 can be integrated only in the ASIC die 302 CMOS H9A and two wire bonds can be performed to bring the two phase clock signals φ1 and φ2 which are necessary to drive the MOS $M_{B1}$, $M_{B2}$, $M_{B3}$, $M_{B4}$ present in the TMOS sensor 31. The introduction of the corresponding pads for the Phase generator 33, which are additional with respect the prior art solution of FIG. 1B, leakage and noise introduce by the ESD protection necessary to such pads do not determine any problem, since such signals do not sum to the actual sensor signal, thus they are not shown in FIG. 2B.

The digital averaging block 34 performs the average of the digital samples which receives at its input taking in account a window of samples over which the average is computed which is a multiple of 2 in number of samples. For instance, the digital averaging block 34 can be obtained with a moving average filter having the following transfer function:

$$OUT(i) = \frac{1}{n}\sum_{j=0}^{n-1} OUT_{ADC}(i-j)$$

If in the digital averaging block 34 n=2, i.e., each output sample OUT is obtained averaging two input samples $OUT_{ADC}$, the output samples OUT are:

$$\begin{cases} OUT(1) = \frac{1}{2} \cdot (OUT_{ADC}(1) + OUT_{ADC}(0)) = (i_{EXP} - i_{BLIND}) \cdot GAIN \cdot G_{ADC} \ i = 1 \\ OUT(2) = \frac{1}{2} \cdot (OUT_{ADC}(2) + OUT_{ADC}(1)) = (i_{EXP} - i_{BLIND}) \cdot GAIN \cdot G_{ADC} \ i = 2 \\ OUT(i) = \frac{1}{2} \cdot (OUT_{ADC}(i) + OUT_{ADC}(i-1)) = (i_{EXP} - i_{BLIND}) \cdot GAIN \cdot G_{ADC} \end{cases}$$

The equation above is underlining how the output signal output sample OUT of the circuital arrangement corresponding to the architecture 30 does not include unwanted signals ($i_{s1}$, $i_{s2}$, $i_{s3}$, $i_{s4}$) and ($i_{s5}$, $i_{s6}$), which $i_s$, the architecture 30 allows to amplify only the actual sensor signal produced by the TMOS sensor 31, ($i_{EXP}$–$i_{BLIND}$), filtering the above mentioned unwanted signals.

In the operation of the solution here described the Phase Generator 33, in accordance with the proposed configuration of the TMOS sensor 31 and the chopper 32, is used to alternate the sign with which the unwanted signals are detected, while the sign of the actual sensor signal $i_s$ not changed. Therefore, by then averaging the read samples with a window which is 2 (i.e., n=2) or multiple of 2 samples, the average of the unwanted signals is zero, while the average of the actual sensor signal, ($i_{EXP}$–$i_{BLIND}$), is maintained.

Thus, in conclusion, in the architecture 30 just shown the unwanted signals coming from the ESD protections (but also the disturbance signal coming from the bias current $I_B$ bias generators 206, 208) do not limit the precision and resolution with which the actual sensor signal coming from the TMOS sensor 31 is read.

Figure 3:
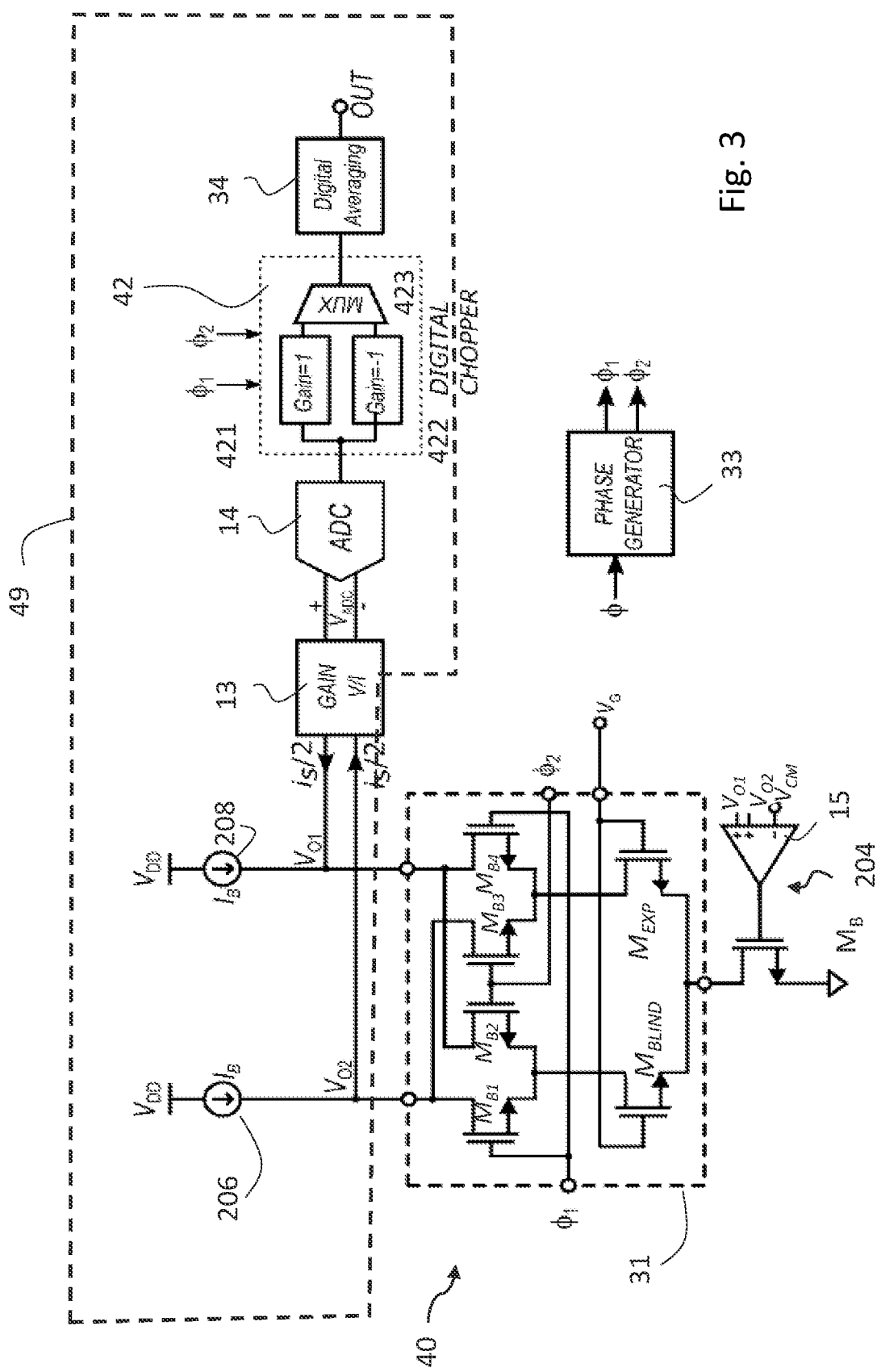
FIG. 3 shows a second embodiment of an architecture of a TMOS sensor and reading circuit according to the solution described herein.

In FIG. 3 it is shown a second architecture of a TMOS sensor and reading arrangement 40 which allows to detect, amplify and convert in the digital domain the signal produced by the TMOS sensor.

The difference between this implementation and that of FIG. 2A lies in the different implementation of the chopper, indicated here with 42, in the ASIC die 302 part, in the amplification interface 49. In the architecture of FIG. 2A the chopper 32 is obtained in an analog way before the conversion carried out by the ADC 14, while in the architecture 40 of FIG. 3 the chopper 42 is obtained in a digital way after the conversion carried out by the ADC 14 and before the digital averaging block 34. The digital chopper 42 comprises two amplifiers 421, 422 with gain 1 and −1 in parallel (i.e., two multipliers by 1 and −1) which outputs are fed to a multiplexer 423. Therefore, after the conversion of the ADC 14 the output digital signal $OUT_{ADC}$ is multiplied by +1 or −1, depending on which output of the multiplexer 423 is selected by a mux selection signal (not shown, but originated by a control module, e.g., a logic module, also not shown, which can also send the input reference phase clock signal $\phi$ and other reference values. The mux selection signal may preferably depend on the phase clock signals (1 and D2. Thus, if $\Phi1=1$ and $\Phi2=0$ the signal multiplied by +1 is selected, while if $\Phi1=0$ and $\Phi2=1$ it $i_s$ selected the signal multiplied by −1), in particular alternating the output according to each sampling interval I, producing however the same effect discussed in the implementation of FIG. 2A. As mentioned, the phase clock signals (1 and D2 logic values can be alternated at each sampling, or may be alternated for instance every two samplings. This, as also mentioned, changes the window over which the average in block 34 is performed, which width in terms of samplings is double of the number of samplings on which the phase clock signals (1 and D2 logic values can be alternated, e.g., two samples of window width in the example shown, or a number multiple of two samples, Therefore, the equations discussed with reference to FIGS. 2A and 2B still apply to the example here discussed.

Figure 4:
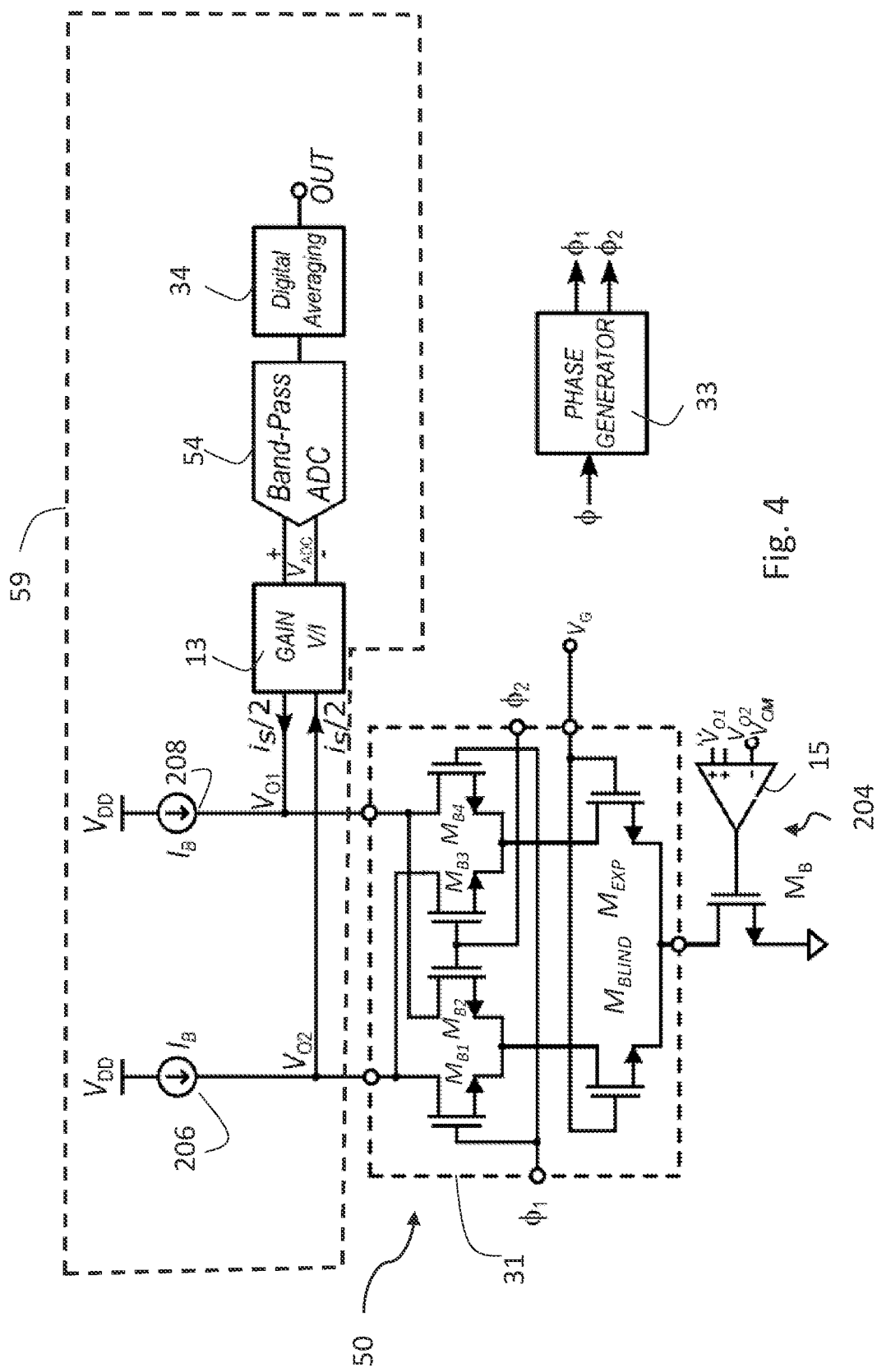
FIG. 4 shows a third embodiment of an architecture of a TMOS sensor and reading circuit according to the solution described herein.

FIG. 4 shows a third architecture, i.e., circuit arrangement, 50 of a TMOS sensor and reading circuit, which allows to detect, amplify and convert in the digital domain the signal produced by the TMOS sensor.

The difference of the architecture 50 with respect to the architecture 30 is that the function obtained by the chopper 32 and the ADC 14 is now obtained by a Band-Pass Sigma Delta ADC 54 in a reading circuit 59.

In this case the MOS transistor $M_{B1}$, $M_{B2}$, $M_{B3}$, $M_{B4}$ of the further first and second pair included in the TMOS sensor 31 operate themselves as a chopper under the control of the phases $\phi1$ and $\phi2$ sent to their gate electrodes as described with reference to FIG. 2A. By their operation the actual sensor signal, ($i_{EXP}$–$i_{BLIND}$), produced by the TMOS sensor 31 is brought to oscillate at an intermediate frequency, determined by the alternance of the phases $\phi1$ and $\phi2$, e.g., the inverse of the sampling period of the ADC 14, while the unwanted, spurious, signals, which do not pass through such MOS transistors $M_{B1}$, $M_{B2}$, $M_{B3}$, $M_{B4}$, are not brought to oscillate at such intermediate frequency, i.e., they remain baseband. In the architecture 30, instead, the chopper 32 is bringing the actual sensor signal ($i_{EXP}$–$L_{BLIND}$) to oscillate at baseband, while the unwanted signals are brought to oscillate at the intermediate frequency. As a consequence, the baseband actual sensor signal is converted to digital by the ADC 14, while the averaging 34 nullifies the unwanted signals at the intermediate frequency. In the architecture 50 of FIG. 4, the Band-Pass Sigma Delta ADC 54 directly carries out a Band-Pass filtering of the actual sensor signal at intermediate frequency and provides an output digital signal which therefore depends only on the signal taken at this intermediate frequency: consequently the unwanted signal is already eliminated from the Band-Pass Sigma Delta ADC 54 itself. The Digital Averaging block 34 here operates as the decimation filter which is necessary to put after an ADC Sigma-Delta, rather than just digital averaging on a number multiple than two of samplings. Therefore, the equations discussed with reference to FIGS. 2A and 2B also in this case still apply.

Thus, the architecture, e.g. an architecture like 30, 40, 50, 60, corresponds substantially the architecture 10 in that it is comprising a sensor circuit, e.g., 31, and an electronic reading circuit, such as 39, or 49 or 59, or 69 of a signal of said sensor circuit 31, said sensor circuit 31 comprising:

a first FET $M_{BLIND}$ and a second FET $M_{EXP}$ arranged in a differential pair, which supplies a differential current ($i_{EXP}$–$L_{BLIND}$) to a respective first node 102 and a respective second node 104;

a differential current reading circuit, e.g., 39; 49; 59, 69, comprising a first input terminal coupled to said second node 10, and a second input terminal coupled to said first node 102, such differential current reading circuit comprising at least an analog to digital converter 14 coupled to said second node 104 and to said first node 102 to output a digital signal $V_{ADC}$, such circuit arrangement comprising an ESD protection circuit, e.g. 21, interposed between at least said first and second node of said sensor circuit 31 and the first and second terminals of said differential current reading circuit, in particular comprising diodes interdicting injection of currents from the voltage supply $V_{DD}$ and ground GND in said nodes and terminals, said ESD protection circuit 21 adding spurious currents, e.g., ($i_{s1}$–$i_{s2}$)+($i_{s4}$–$i_{s3}$)+($i_{s5}$–$i_{s6}$), to the differential sensor current ($i_{EXP}$–$L_{BLIND}$). Specifically, the said circuit arrangement 30, 40, 50, 60 comprises:

a phase clock signal generator, e.g., 33, generating complementary phase clock signals $\phi1$, $\phi2$ having a period corresponding to the sampling interval of the analog to digital converter 14, and the sensor circuit 31 further comprises:

a circuit $M_{B1}$, $M_{B2}$, $M_{B3}$, $M_{B4}$, for switching the sign of said differential sensor current ($i_{EXP}$–$L_{BLIND}$) according to said period of the complementary phase clock signals ϕ1, ϕ2 before inputting said ESD protection circuit 21, in particular the first and second further pairs of FETs described above, although different arrangement of switches changing the sign of the sensor differential current are possible.

Then, the architecture comprises a differential current reading circuit comprising a circuit, e.g., 32, 34; 42, 34; 54, 34, configured for operating a selection of signals at its output depending on the value of said period of the phase clock signals ϕ1, ϕ2, selecting said differential sensor current ($i_{EXP}-i_{BLIND}$) and eliminating said spurious currents $(i_{s1}-i_{s2})+(i_{s4}-i_{s3})+(i_{s5}-i_{s6})$. Such circuit either swaps the signals from the ESD protection circuit 21 (with the chopper 32 before the ADC or the digital chopper after the ADC) and performs a digital averaging 34, or uses only a bandpass sigma delta ADC converter, which therefore includes the ADC function, as a filter at the intermediate frequency of the phase clock signals, then performs the averaging 34.

Figure 5A:
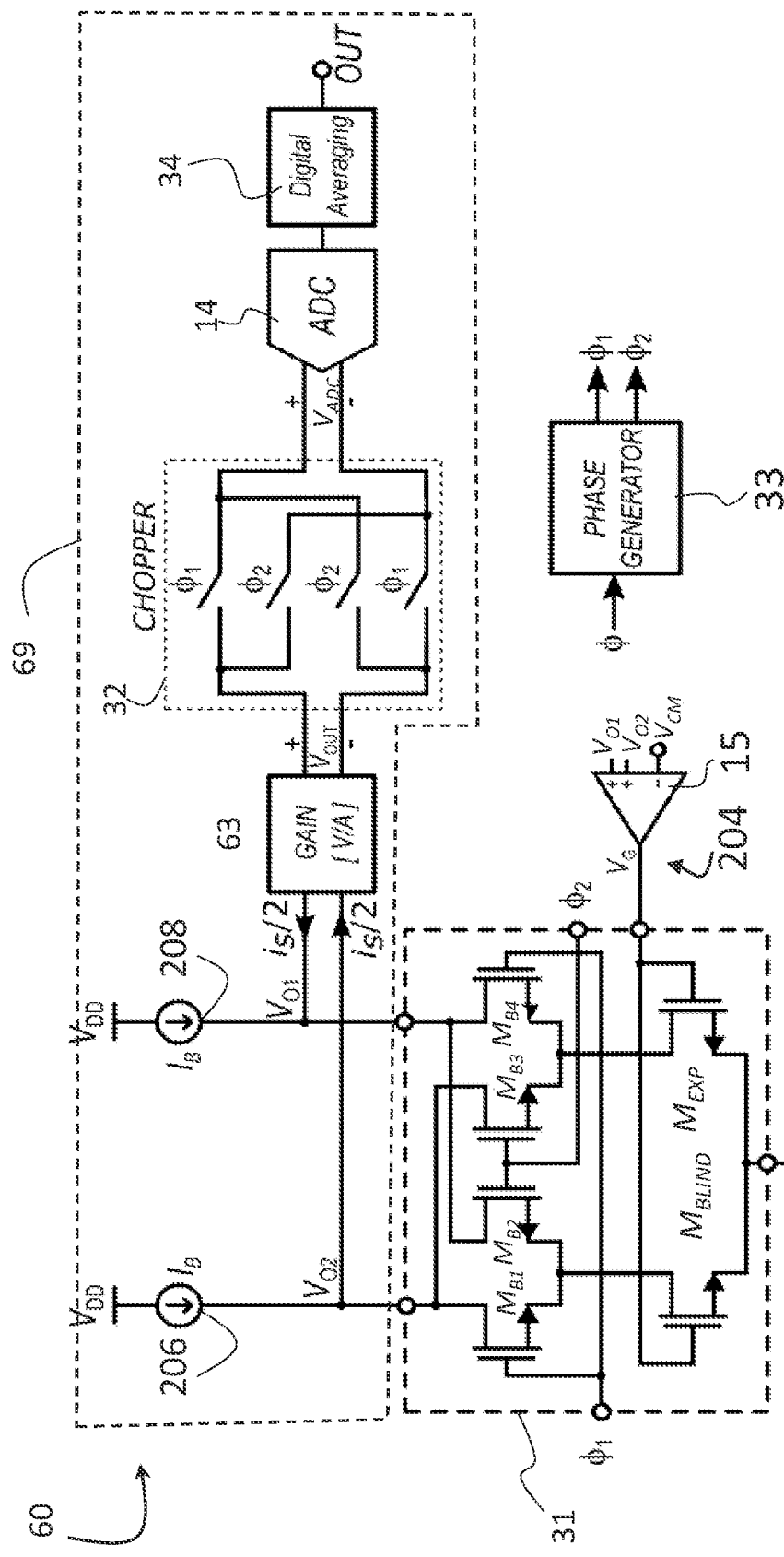
FIG. 5A shows schematically an architecture of a TMOS sensor and reading circuit according to the solution described herein.

FIG. 5A shows a fourth architecture 60 to detect, amplify, and convert in the digital domain the actual sensor signal from the TMOS sensor 31.

Figure 5B:
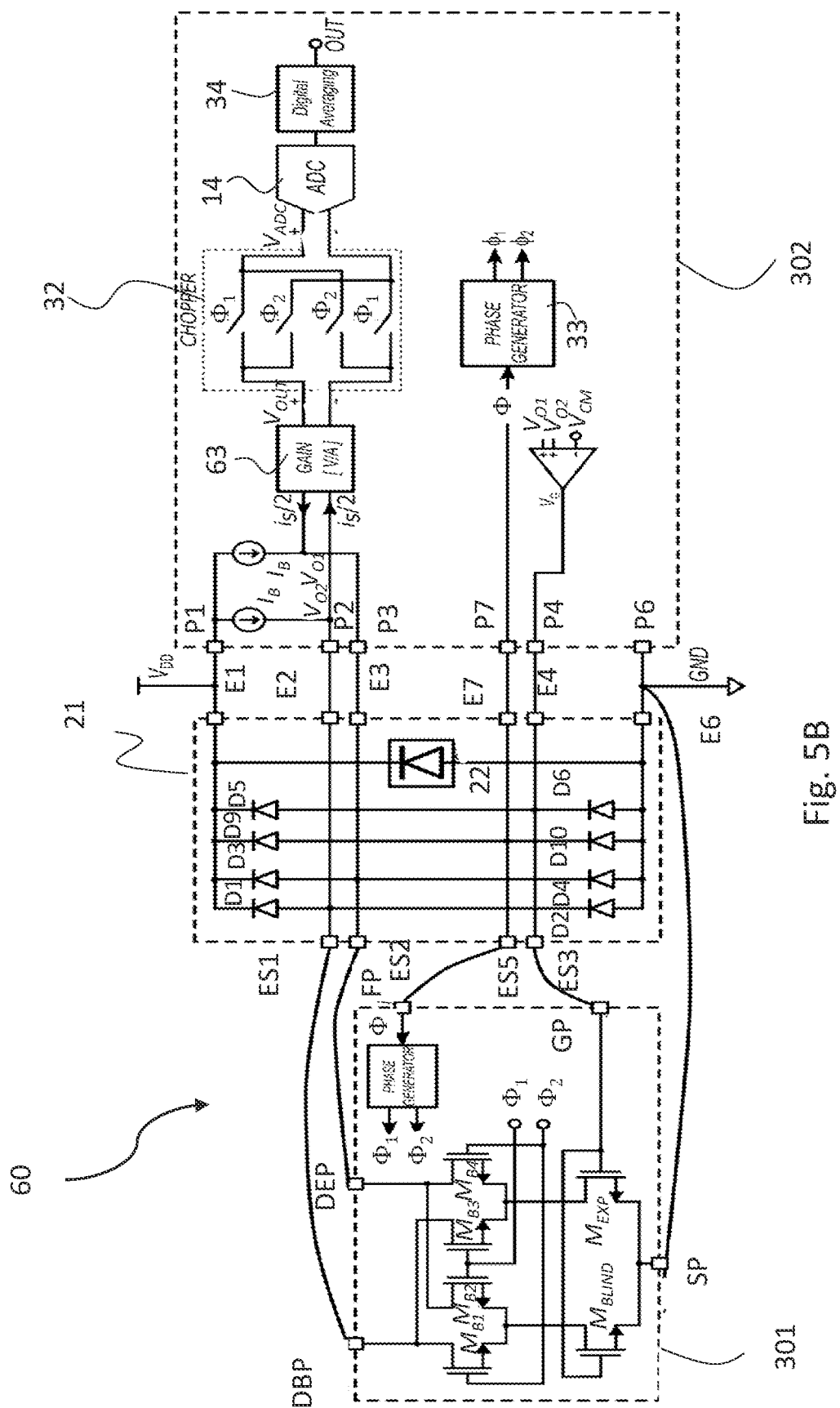
FIG. 5B shows schematically the architecture of FIG. 5A equipped with a ESD protection.

FIG. 5B shows the same architecture including the ESD protection 21 and the related pads for the bonding.

The difference of the fourth architecture 60 with respect to the architecture 30 consists in that the source of the MOS of the TMOS sensor 11 is coupled to ground GND and the control of the common mode rejection is performed by controlling the bias voltage VG of the gate of MOS $M_{BLIND}$ and $M_{EXP}$. In the architecture with protection ESD shown in FIG. 5B, since the TMOS source 106 is coupled to ground GND, it is not necessary to insert the ESD protection 21 on the source pad SP (i.e. ESD protection 21 in this case comprises diodes D1, D3, D5, D9 on the voltage supply $V_{DD}$ and D2, D4, D6, D10 on the ground GND, correspondingly sensor 31 comprises pads DEP, DBP, FP, SP, GP, as the ESD protection circuit 21 comprises all the pads of FIG. 2B with the exception of pads E4 and ES4), and therefore no contribution $i_s$ injected from the source: in some very high accuracy applications this could be useful to improve accuracy when reading the TMOS signal. In all the previous proposed electronic architectures, i.e., circuit arrangements, the unwanted current signals on the source terminals are highly rejected by circuits 15, 204, and attenuated before being added to the useful signal of the TMOS sensor: in the architecture of FIG. 5A instead this contribution from the source $i_s$ completely eliminated. It is therefore deduced that for the architecture of FIG. 5A the mathematical calculations and conclusions that have been reached for the architecture of FIG. 2A can be reported and reproduced.

Consequently, in various embodiments, the solutions proposed allow to amplify the signal generated by a TMOS sensor with very high accuracy, as the unwanted contributions coming from the ESD protections and the unwanted contributions due to the bias currents of the TMOS are eliminated and are not superimposed on the useful signal generated by the TMOS. The solution here described presents a new circuit arrangement of the TMOS sensor and of the amplification architectures in order to allow a high resolution in the detection of the actual sensor signal produced by the TMOS sensor avoiding the need to add further process steps in MEMS technology.

In general, the solution proposed has been devised to amplify the signal generated by TMOS transistors, but can also be used in the case where the transistors $M_{BLIND}$ and $M_{EXP}$ are two normal MOS transistors, or in general FETs, and a differential signal to be amplified $i_s$ supplied to their input (i.e., to the gate terminals of the two transistors).

Advantageously, in the solution proposed, even though signals synchronous with a clock are necessary for operation of the sigma-delta converter, it is possible to choose the frequency to optimize reduction of current consumption.

The claims form an integral part of the technical teaching of the disclosure provided herein.

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:

1. A circuit arrangement, comprising:
a first integrated circuit die comprising:
  a sensor circuit comprising a first FET and a second FET arranged in a differential pair and configured to supply a differential current at a respective first node and a respective second node; and
  a circuit configured to switch a sign of said differential current according to a period of complementary phase clock signals to supply a sign switched differential current at a third node and a fourth node;
a second integrated circuit die comprising:
  an electronic reading circuit comprising a differential current reading circuit including a first input terminal coupled to said third node and a second input terminal coupled to said fourth node, said differential current reading circuit comprising a current to voltage converter coupled to the first and second input terminals and an analog to digital converter coupled to outputs of the current to voltage converter and configured to output a digital signal; and
  a circuit configured to operate a selection of signals at its output depending on a value of said period of the complementary phase clock signals, select said sign switched differential current and eliminate spurious currents;
  an ESD protection circuit interposed between at least said third and fourth node of said circuit configured to switch the sign and the first and second input terminals of said differential current reading circuit, wherein said ESD protection circuit comprises diodes applying injection of currents from voltage supply and ground at the third and fourth nodes of the circuit configured to switch the sign and at the first and second input terminals of the differential current reading circuit and adds said spurious currents to said sign switched differential current supplied by the circuit configured to switch the sign; and
  a phase clock signal generator generating the complementary phase clock signals, wherein the period corresponds to one of a sampling interval of said analog to digital converter or a multiple of said sampling interval.

2. The circuit arrangement according to claim 1, wherein said circuit configured to operate the selection of signals depending on the value of said period of the complementary phase clock signals comprises:
a chopper circuit coupled to the ESD protection circuit and configured to switch signal polarity; and
a digital averaging circuit coupled to receive the digital signal from the analog to digital converter and perform an averaging over a window of sampling intervals which is double of said period of the complementary phase clock signals.

3. The circuit arrangement according to claim 2, wherein said chopper circuit is coupled to the input of the analog to digital converter.

4. The circuit arrangement according to claim 2, wherein said chopper circuit is coupled to the output of the analog to digital converter and operates digitally.

5. The circuit arrangement according to claim 1, wherein said circuit configured to operate the selection of signals depending on the value of said period of the complementary phase clock signals comprises a bandpass sigma delta converter and further comprising a digital averaging circuit coupled to an output of the bandpass sigma delta analog to digital converter and configured to operate as a decimation filter with respect to the output of the bandpass sigma delta converter.

6. The circuit arrangement according to claim 1, wherein:
said circuit configured to switch the sign of said differential sensor current according to said period of the complementary phase clock signals comprises a first differential pair and a second differential pair of FETs coupled between the first differential pair of FETs and the first node and the second differential pair of FETs and the second node; and
wherein said phase clock signal generator generating complementary phase clock signal applies the complementary phase clock signals to drive the further first differential pair and second differential pair.

7. The circuit arrangement according to claim 1, wherein said sensor circuit comprises:
a drain terminal of said first FET coupled to said first node, a drain terminal of said second FET coupled to said second node, and source terminals of said first FET and said second FET coupled to a third node; and
wherein the circuit arrangement further comprises a third FET having a drain terminal coupled to said third node and a source terminal coupled to a reference voltage.

8. The circuit arrangement according to claim 7, wherein the second integrated circuit die further comprises a regulation circuit configured to drive a gate terminal of said third FET to regulate a common mode of a voltage at said first node and regulate a common mode of a voltage at said second node; wherein said regulation circuit is configured to drive said gate terminal of said third FET such that: (VO1+VO1)/2=VCM, where VO1 is the voltage at said first node, VO2 is the voltage at said second node, and VCM is the common mode.

9. The circuit arrangement according to claim 1, wherein said first FET and said second FET are MOS transistors.

10. The circuit arrangement according to claim 1, wherein said first FET and said second FET are n-channel MOS transistors.

11. The circuit arrangement according to claim 1, wherein said first FET and said second FET are TMOS transistors.

12. The circuit arrangement according to claim 1, wherein the first integrated circuit die is supported by a silicon on insulator (SOI) substrate and wherein the second integrated circuit die is supported by a bulk semiconductor substrate.

13. A circuit arrangement, comprising:
a first integrated circuit die comprising:
a sensor circuit comprising a first FET and a second FET arranged in a differential pair and configured to supply a differential current at a respective first node and a respective second node; and
a circuit configured to switch a sign of said differential current according to a period of complementary phase clock signals to supply a sign switched differential current at a respective third node and a respective fourth node;
a second integrated circuit die comprising:
a gain circuit having first and second inputs connected to the third node and fourth node, respectively, of the circuit configured to switch the sign and configured to receive said sign switched differential current, said gain circuit further having a first and second outputs;
a chopper circuit controlled by said complementary phase clock signals and having first and second inputs connected to the first and second outputs, respectively, of the gain circuit; and
an analog to digital converter coupled to the first and second outputs of the chopper circuit and configured to output a digital signal; and
an ESD protection circuit comprising diodes applying injection of currents from voltage supply and ground to the sign switched differential current at the connection of the third node and fourth node of the circuit configured to switch the sign to the first and second inputs of the gain circuit.

14. The circuit arrangement according to claim 13:
wherein the first integrated circuit die further comprises a first phase clock signal generator generating the complementary phase clock signals for the circuit configured to switch the sign from a reference clock signal; and
wherein the second integrated circuit die further comprises a second phase clock signal generator generating the complementary phase clock signals for the chopper circuit from said reference clock signal.

15. The circuit arrangement according to claim 14, wherein the ESD circuit is further configured to applying injection of currents from voltage supply and ground to the reference clock signal.

* * * * *